US011237028B1

(12) United States Patent
Surineedi et al.

(10) Patent No.: US 11,237,028 B1
(45) Date of Patent: Feb. 1, 2022

(54) SENSOR APPARATUS WITH COOLING

(71) Applicant: Ford Global Technologies, LLC, Dearborn, MI (US)

(72) Inventors: Raghuraman Surineedi, Dearborn, MI (US); Michael Robertson, Jr., Garden City, MI (US); Rashaun Phinisee, Ypsilanti, MI (US); Venkatesh Krishnan, Canton, MI (US); Segundo Baldovino, Novi, MI (US); Sunil Reddy Patil, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 64 days.

(21) Appl. No.: 16/944,321

(22) Filed: Jul. 31, 2020

(51) Int. Cl.
*G01S 7/03* (2006.01)
*G01D 11/24* (2006.01)
*H05K 7/20* (2006.01)
*G01S 7/481* (2006.01)

(52) U.S. Cl.
CPC ....... *G01D 11/245* (2013.01); *H05K 7/20336* (2013.01); *G01S 7/03* (2013.01); *G01S 7/4813* (2013.01)

(58) Field of Classification Search
CPC ....... G01S 7/03; G01S 7/4813; G01D 11/245; H05K 7/20336
See application file for complete search history.

(56) References Cited

U.S. PATENT DOCUMENTS

| | | | |
|---|---|---|---|
| 10,099,630 B1* | 10/2018 | Krishnan | B60Q 1/0023 |
| 10,150,432 B2* | 12/2018 | Dry | B60R 16/0232 |
| 10,302,744 B1* | 5/2019 | Krishnan | G01S 17/04 |
| 10,359,303 B1* | 7/2019 | Krishnan | B60R 11/00 |
| 10,435,077 B2* | 10/2019 | Schmidt | B60R 13/07 |
| 10,529,233 B1* | 1/2020 | Vieten | G06K 9/0063 |
| 10,597,089 B2* | 3/2020 | Ghannam | B62D 25/06 |
| 10,627,488 B2* | 4/2020 | Dubey | G01S 7/4813 |
| 10,647,173 B2* | 5/2020 | Ghannam | B60H 1/00271 |
| 10,761,190 B1* | 9/2020 | Sykula | G01S 7/4813 |
| 10,794,735 B2* | 10/2020 | Krishnan | G01D 11/245 |
| 10,802,121 B1* | 10/2020 | Krishnan | G01S 17/86 |
| 10,838,416 B1* | 11/2020 | Awad Alla | B60W 60/005 |
| 10,928,225 B1* | 2/2021 | Krishnan | G01D 11/245 |
| 10,946,838 B2* | 3/2021 | Sykula | B60S 1/56 |
| 10,953,809 B2* | 3/2021 | Krishnan | B60R 11/04 |
| 10,981,518 B1* | 4/2021 | Krishnan | E05F 15/73 |
| 11,084,464 B2 | 8/2021 | Velasco | B60S 1/486 |
| 11,099,039 B2* | 8/2021 | Krishnan | G01L 19/14 |
| 2020/0001331 A1 | 1/2020 | Deane et al. | |

* cited by examiner

*Primary Examiner* — Jamel E Williams
(74) *Attorney, Agent, or Firm* — Frank A. MacKenzie; Bejin Bieneman PLC

(57) ABSTRACT

A sensor apparatus includes a sensor, a heat pipe, and a cover. The sensor includes a sensor housing. The sensor housing includes a sensor window oriented generally vertically and a top surface fixed relative to the sensor window above the sensor window and oriented generally horizontally. The heat pipe is fixed relative to the sensor, wherein the heat pipe is elongated from a first end to a second end, the first end is contacting the top surface, and the second end is spaced from the top surface. The cover covers the top surface and the heat pipe, and the cover is shaped to define a vertical gap between the top surface and the cover.

19 Claims, 5 Drawing Sheets

SENSOR APPARATUS WITH COOLING

BACKGROUND

Vehicles, such as autonomous or semi-autonomous vehicles, typically include a variety of sensors. Some sensors detect internal states of the vehicle, for example, wheel speed, wheel orientation, and engine and transmission variables. Some sensors detect the position or orientation of the vehicle, for example, global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. Some sensors detect the external world, for example, radar sensors, scanning laser range finders, light detection and ranging (LIDAR) devices, and image processing sensors such as cameras. A LIDAR device detects distances to objects by emitting laser pulses and measuring the time of flight for the pulse to travel to the object and back. Some sensors are communications devices, for example, vehicle-to-infrastructure (V2I) or vehicle-to-vehicle (V2V) devices. Sensor operation can be affected by obstructions, e.g., dust, snow, insects, etc.

DETAILED DESCRIPTION

Figure 1:
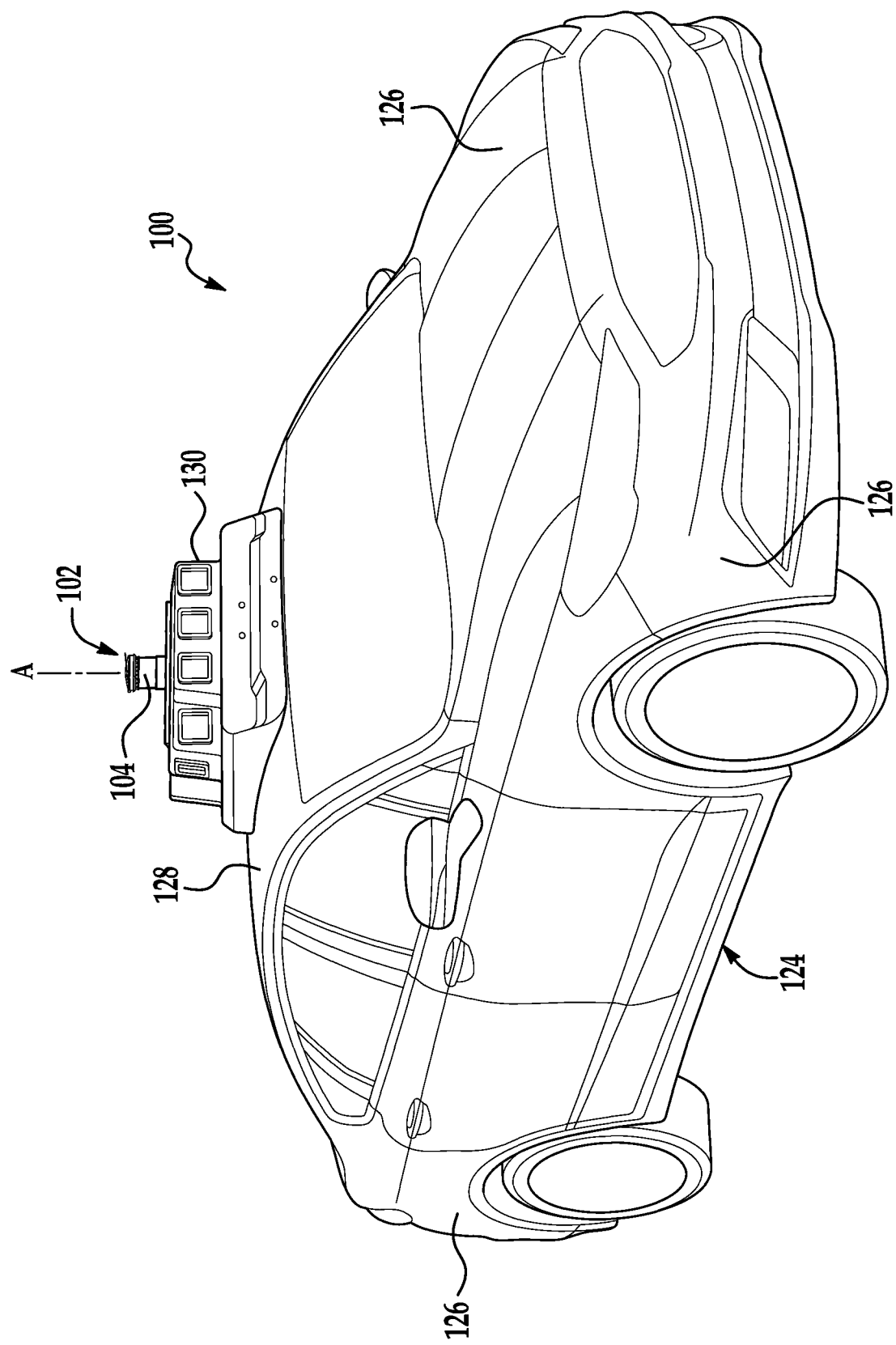
FIG. 1 is a perspective view of an example vehicle including a housing for sensors.

A sensor apparatus includes a sensor including a sensor housing, wherein the sensor housing includes a sensor window oriented generally vertically and a top surface fixed relative to the sensor window above the sensor window and oriented generally horizontally; a heat pipe fixed relative to the sensor, wherein the heat pipe is elongated from a first end to a second end, the first end is contacting the top surface, and the second end is spaced from the top surface; and a cover covering the top surface and the heat pipe, wherein the cover is shaped to define a vertical gap between the top surface and the cover.

The top surface may include an edge encircling the top surface, and the cover includes a lip extending below the edge. The sensor may include a lateral surface extending from the sensor window to the edge, and the lip and the lateral surface may form an inlet permitting airflow from below the top surface to the vertical gap between the top surface and the cover. The sensor apparatus may further include an air nozzle, the sensor window may extend vertically from a bottom edge to a top edge, the air nozzle may be positioned at the bottom edge, the lateral surface may extend from the top edge, and the air nozzle may be aimed at the inlet. The sensor window may be unobstructed from the bottom edge to the top edge.

The cover may include an intake opening oriented to permit entry of horizontal airflow relative to the sensor into the vertical gap. The cover may include an exhaust opening oriented to permit exit of horizontal airflow relative to the sensor from the vertical gap. A cross-sectional area of the exhaust opening may be greater than a cross-sectional area of the intake opening.

The intake opening and the exhaust opening may be oriented in opposite horizontal directions.

The cover may include at least one vent positioned directly above the top surface.

The sensor window may be cylindrical and defines an axis that is oriented vertically. The first end of the heat pipe may be radially closer to the axis than the second end of the heat pipe. The top surface may be circular and centered on the axis, and the second end of the heat pipe may be radially outside the top surface relative to the axis. The sensor apparatus may further include a plurality of heat pipes including the heat pipe, each heat pipe may be elongated from a respective first end contacting the top surface to a respective second end spaced from the top surface, each first end of the respective heat pipe may be radially closer to the axis than the respective second end of that heat pipe, and each second end of the respective heat pipe may be radially outside the top surface relative to the axis.

The top surface may include an edge encircling the top surface, and the cover includes a lip extending below the edge and extending at least 270° around the axis. The sensor may include a cylindrical lateral surface extending from the sensor window to the edge, the lip and the lateral surface may form an inlet permitting airflow from below the top surface to the vertical gap between the top surface and the cover, and the inlet may extend at least 270° around the axis.

The top surface may include a plurality of fins oriented parallel to each other. The heat pipe may include a first segment extending from the first end, and the first segment may be oriented parallel to the fins and positioned directly between two adjacent fins of the plurality of fins. The heat pipe may include a second segment extending from the first segment to the second end, and the second segment is spaced from the top surface.

With reference to the Figures, a sensor apparatus 102 for a vehicle 100 includes a sensor 104, a heat pipe 106, and a cover 116. The sensor 104 includes a sensor housing 110. The sensor housing 110 includes a sensor window 114 oriented generally vertically and a top surface 118 fixed relative to the sensor window 114 above the sensor window 114 and oriented generally horizontally. The heat pipe 106 is fixed relative to the sensor 104, wherein the heat pipe 106 is elongated from a first end 108 to a second end 112, the first end 108 is contacting the top surface 118, and the second end 112 is spaced from the top surface 118. The cover 116 covers the top surface 118 and the heat pipe 106, and the cover 116 is shaped to define a vertical gap 120 between the top surface 118 and the cover 116.

The sensor apparatus 102 provides a way to efficiently dissipate heat generated by the sensor 104 and to prevent external heat from being absorbed by the sensor apparatus 102. The cover 116 forms a route for airflow from, e.g., an air nozzle 122 to pass over the fins 146 and absorb heat generated by the sensor 104, thus removing the heat from the sensor apparatus 102. The heat pipes 106 transport heat away from the top surface 118 and make the heat more easily absorbed into the airflow. The cover 116 can also shield the top surface 118 of the sensor apparatus 102 from sunlight. The sensor apparatus 102 provides these benefits with a small number of generally nonmoving parts.

With reference to FIG. 1, the vehicle 100 may be any suitable type of automobile, e.g., a passenger or commercial automobile such as a sedan, a coupe, a truck, a sport utility vehicle, a crossover vehicle, a van, a minivan, a taxi, a bus, etc.

The vehicle 100 may be an autonomous vehicle. A computer can be programmed to operate the vehicle 100 independently of the intervention of a human driver, completely or to a lesser degree. The computer may be programmed to operate the propulsion, brake system, steering, and/or other vehicle 100 systems based at least in part on data received from the sensor 104. For the purposes of this disclosure, autonomous operation means the computer controls the propulsion device, brake system, and steering system without input from a human driver; semi-autonomous operation means the computer controls one or two of the propulsion system, brake system, and steering system and a human driver controls the remainder; and nonautonomous operation means a human driver controls the propulsion system, brake system, and steering system.

The vehicle 100 may include a body 124. The body 124 includes body panels 126 partially defining an exterior of the vehicle 100. The body panels 126 may present a class-A surface, e.g., a finished surface exposed to view by a customer and free of unaesthetic blemishes and defects. The body panels 126 include, e.g., a roof 128, etc.

Figure 2:
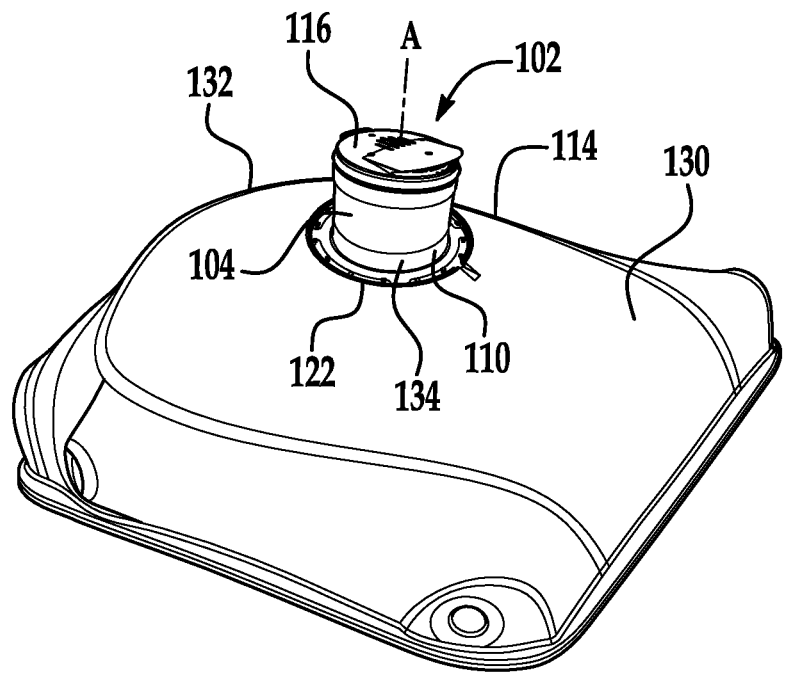
FIG. 2 is a rear perspective view of the housing.

With reference to FIG. 2, a housing 130 for the sensor 104 and other sensors is attachable to the vehicle 100, e.g., to one of the body panels 126 of the vehicle 100, e.g., the roof 128. For example, the housing 130 may be shaped to be attachable to the roof 128, e.g., may have a shape matching a contour of the roof 128. The housing 130 may be attached to the roof 128, which can provide the sensors 104 with an unobstructed field of view of an area around the vehicle 100. The housing 130 may be formed of, e.g., plastic or metal.

The sensor apparatus 102 includes the sensor 104. The sensor 104 is supported by the housing 130. The sensor 104 can be disposed on top of the housing 130 at a highest point of the housing 130. The sensor 104 has a cylindrical shape and defines an axis A.

The sensor 104 may be designed to detect features of the outside world; for example, the sensor 104 may be a radar sensor, a scanning laser range finder, a light detection and ranging (LIDAR) device, or an image processing sensor such as a camera. In particular, the sensor 104 may be a LIDAR device, e.g., a scanning LIDAR device. A LIDAR device detects distances to objects by emitting laser pulses at a particular wavelength and measuring the time of flight for the pulse to travel to the object and back. The operation of the sensor 104 is performed by a sensing device 140 inside the sensor housing 110. The sensor 104 has a field of view encompassing a region from which the sensor 104 receives input.

Figure 3:
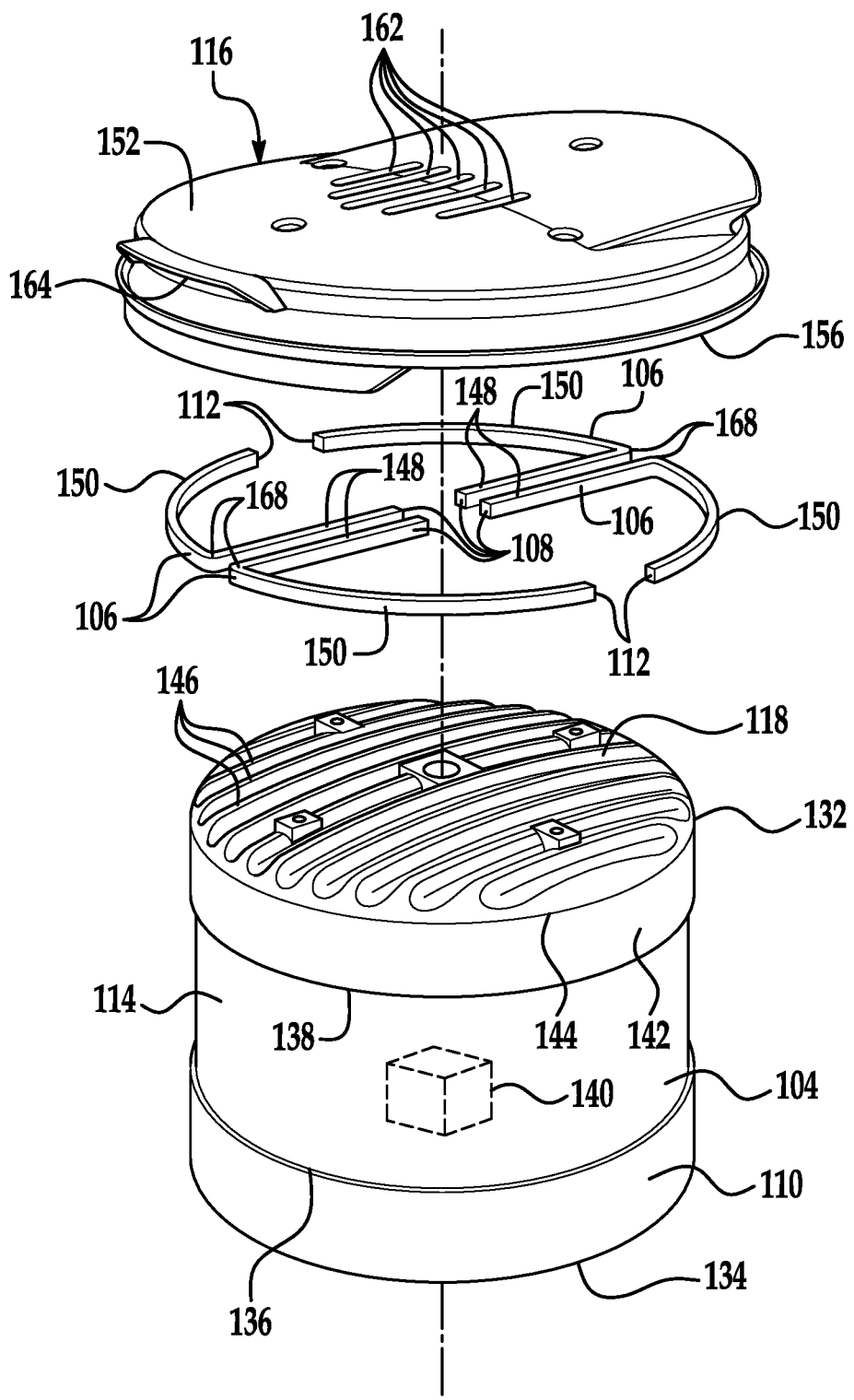
FIG. 3 is an exploded perspective view of an example sensor, heat pipes, and cover.

With reference to FIG. 3, the sensor 104 includes the sensor housing 110. The sensor housing 110 includes a sensor-housing top 132, the sensor window 114, and a sensor-housing bottom 134. The sensor-housing top 132 is disposed directly above the sensor window 114, and the sensor-housing bottom 134 is disposed directly below the sensor window 114. The sensor-housing top 132 and the sensor-housing bottom 134 are vertically spaced apart by a height of the sensor window 114.

The sensor window 114 is oriented generally vertically, i.e., extends up and down. The sensor window 114 is cylindrical and defines the axis A, which is oriented vertically. The sensor window 114 extends around the axis A. The sensor window 114 can extend fully around the axis A, i.e., 360°, or partially around the axis A. The sensor window 114 extends along the axis A, i.e., vertically, from a bottom edge 136 to a top edge 138. The bottom edge 136 contacts the sensor-housing bottom 134, and the top edge 138 contacts the sensor-housing top 132. The sensor window 114 has an outer diameter. The outer diameter of the sensor window 114 may be the same as an outer diameter of the sensor-housing top 132 and/or of the sensor-housing bottom 134; in other words, the sensor window 114 may be flush or substantially flush with the sensor-housing top 132 and/or the sensor-housing bottom 134. "Substantially flush" means a seam between the sensor window 114 and the sensor-housing top 132 or sensor-housing bottom 134 does not cause turbulence in air flowing along the sensor window 114. At least some of the sensor window 114 is transparent with respect to whatever medium the sensor 104 is capable of detecting. For example, if the sensor 104 is a LIDAR device, then the sensor window 114 is transparent with respect to visible light at the wavelength generated by the sensor 104. The field of view of the sensor 104 extends through the sensor window 114. As explained more fully below, the sensor window 114 is unobstructed from the bottom edge 136 to the top edge 138.

The sensor-housing top 132 is cylindrical in shape and defines the axis A. The sensor-housing top 132 extends upward from the sensor window 114. The sensor-housing top 132 is mounted to and fixed relative to the sensor window 114. The sensor-housing top 132 is positioned to receive heat generated by the sensing device 140 responsible for the operation of the sensor 104; for example, the sensor-housing top 132 is directly above the sensing device 140, and convection transfers heat via the air inside the sensor housing 110 from the sensor 104 to the sensor-housing top 132.

The sensor-housing top 132 includes a lateral surface 142 and the top surface 118. The top surface 118 faces up, i.e., in a vehicle-upward direction, i.e., axially relative to the axis A, and the lateral surface 142 faces horizontally outward, i.e., radially relative to the axis A. The top surface 118 includes an edge 144 at which the lateral surface 142 borders the top surface 118. The edge 144 encircles the top surface 118. The lateral surface 142 extends vertically upward from the top edge 138 of the sensor window 114 to the edge 144 of the top surface 118. The top surface 118 is oriented generally horizontally, transverse to the lateral surface 142. The top edge 138 of the sensor window 114 is spaced from the top surface 118 by a height of the lateral surface 142.

The top surface 118 has a circular shape and is centered on the axis A. The top surface 118 is oriented orthogonal to the axis A. A highest point of the top surface 118 is at a center of the top surface 118, i.e., a point at which the axis A intersects the top surface 118. A slope of the top surface 118 (neglecting fins 146 described below) is horizontal at the center point. The top surface 118 slopes gradually downward in a radially outward direction from the center point, i.e., from the axis A. The slope of the top surface 118 is closer to horizontal closer to the center point and is steeper farther from the center point.

The top surface 118 includes a plurality of the fins 146. The fins 146 extend upward from the rest of the top surface 118, and the fins 146 are oriented parallel to each other. The fins 146 can be oriented along a vehicle-forward direction. The fins 146 are thermally conductive, i.e., have a high thermal conductivity, e.g., a thermal conductivity equal to at least 15 watts per meter-Kelvin (W/(m K)), e.g., greater than 100 W/(m K), at 25° C. For example, the fins 146 may be aluminum.

Returning to FIG. 2, the sensor apparatus 102 includes at least one air nozzle 122. The air nozzle 122 is mounted on the housing 130. The air nozzle 122 is positioned below the sensor window 114 at the bottom edge 136 of the sensor window 114. The air nozzle 122 is arranged circumferentially around the sensor housing 110; e.g., the air nozzle 122 has a slot shape elongated circumferentially 360° around the sensor housing 110 (as shown in FIG. 2), or a plurality of the air nozzles 122 are arranged in a circle around the sensor housing 110 centered on the axis A. The air nozzle 122 is aimed upward, e.g., aimed in a direction parallel to the axis A. The air nozzle 122 can receive airflow from, e.g., a compressor or blower (not shown). The air nozzle 122 is open to the ambient environment.

Figure 4:
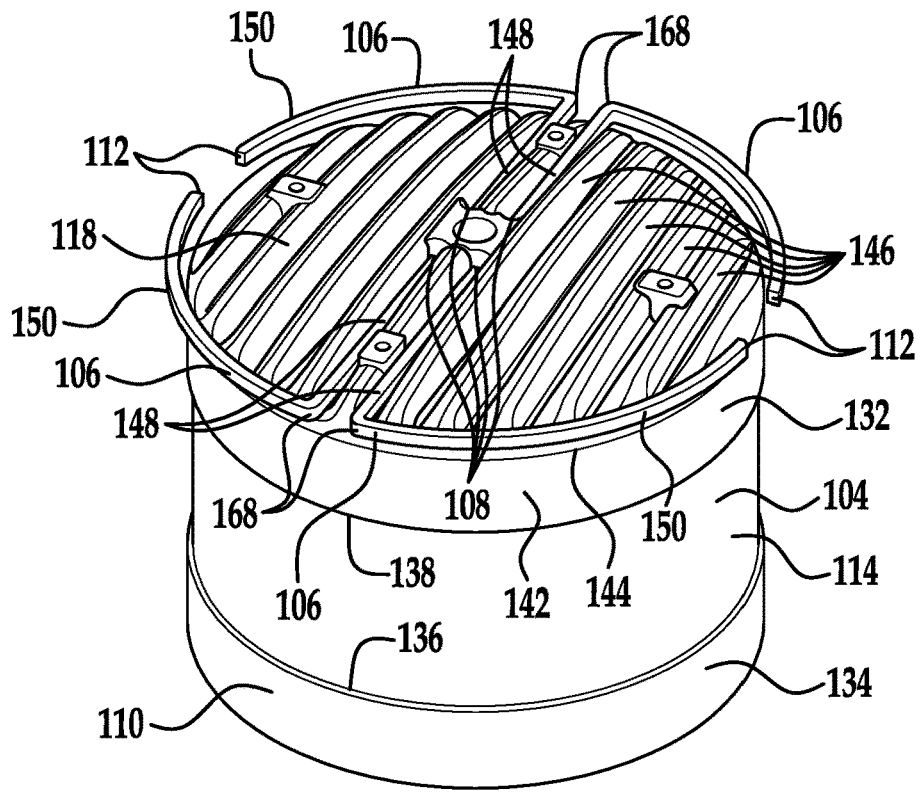
FIG. 4 is a perspective view of the sensor and the heat pipes.
Figure 5:
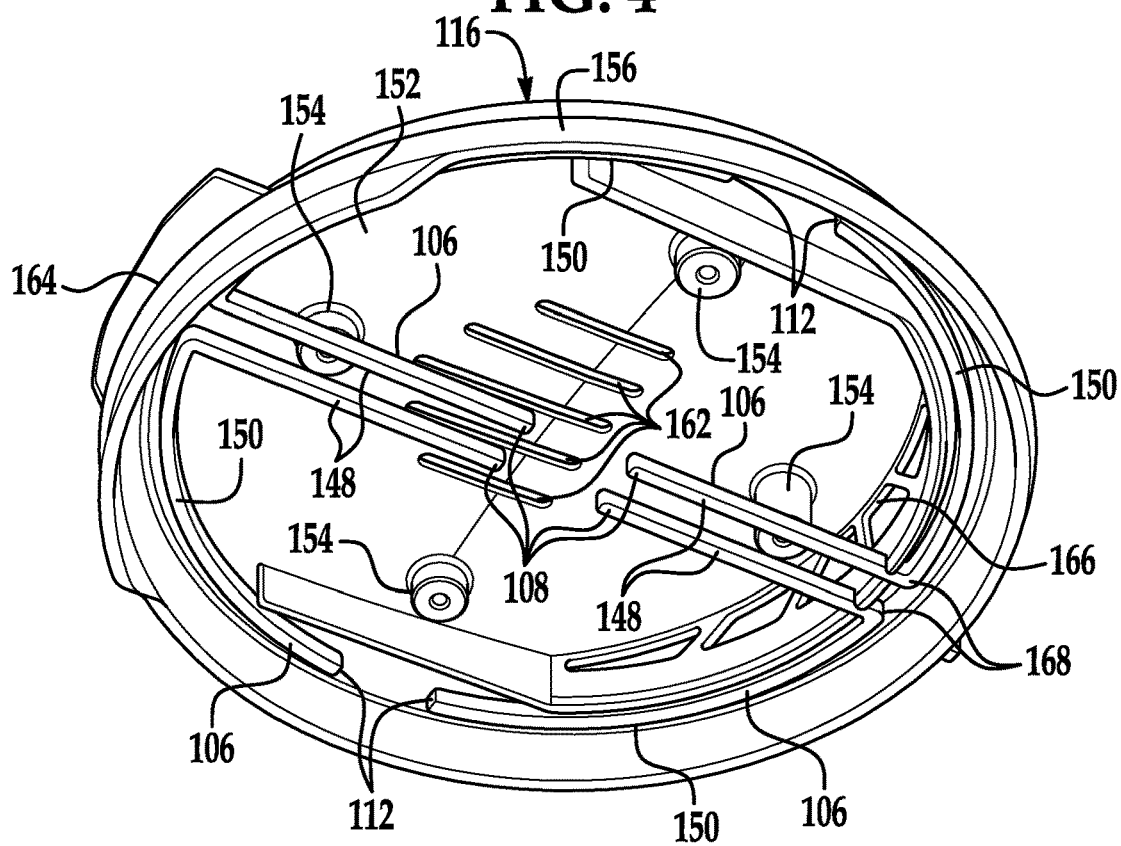
FIG. 5 is a bottom perspective view of the cover and the heat pipes.

With reference to FIGS. 4 and 5, the sensor apparatus 102 includes at least one heat pipe 106, e.g., a plurality of heat pipes 106, such as four heat pipes 106 as shown in the Figures. The heat pipes 106 are fixed relative to the sensor 104. For example, the heat pipes 106 can be adhered to or clamped to the top surface 118 of the sensor housing 110.

Each heat pipe 106 is elongated from the respective first end 108 to the respective second end 112. Each first end 108 is contacting the top surface 118. Each first end 108 can be positioned directly between two adjacent fins 146 of the fins 146 of the top surface 118. The first ends 108 of the heat pipes 106 contact the top surface 118. The first ends 108 of the heat pipe 106 are radially closer to the axis A than the respective second ends 112. Each second end 112 is spaced from the top surface 118. The second ends 112 of the heat pipes 106 are radially outside the top surface 118 relative to the axis A.

Each heat pipe 106 includes a first segment 148 and a second segment 150. Each first segment 148 extends from the respective first end 108, and each second segment 150 extends from the respective first segment 148 to the respective second end 112. Each respective first segment 148 and second segment 150 can meet, e.g., at a corner 168. Each first segment 148 is oriented parallel to the fins 146 and is positioned directly between two adjacent fins 146 of the plurality of fins 146. An entirety of each second segment 150 is spaced from the top surface 118; e.g., each second segment 150 is disposed radially outside the top surface 118. Each second segment 150 can extend circumferentially around the axis A with a constant radial distance from the edge 144 of the top surface 118, from the respective first segment 148 to the respective second end 112.

A heat pipe 106 is a heat-transfer device in which a working fluid evaporates inside the heat pipe 106 at a "hot" end and condenses inside the heat pipe 106 at a "cool" end. Evaporation absorbs heat, and condensation releases heat. In this case, the first end 108 is the hot end, and the second end 112 is the cool end. A vapor cavity 172 and a wick 174 (shown in FIG. 7) extend from the first end 108 to the second end 112. Evaporated working fluid can move from the first end 108 to the second end 112 via the vapor cavity 172, and condensed working fluid can move back from the second end 112 to the first end 108 via the wick 174, e.g., by capillary action. The working fluid can be water, ammonia, etc., according to the temperature range from the hot end to the cold end.

Figure 6:
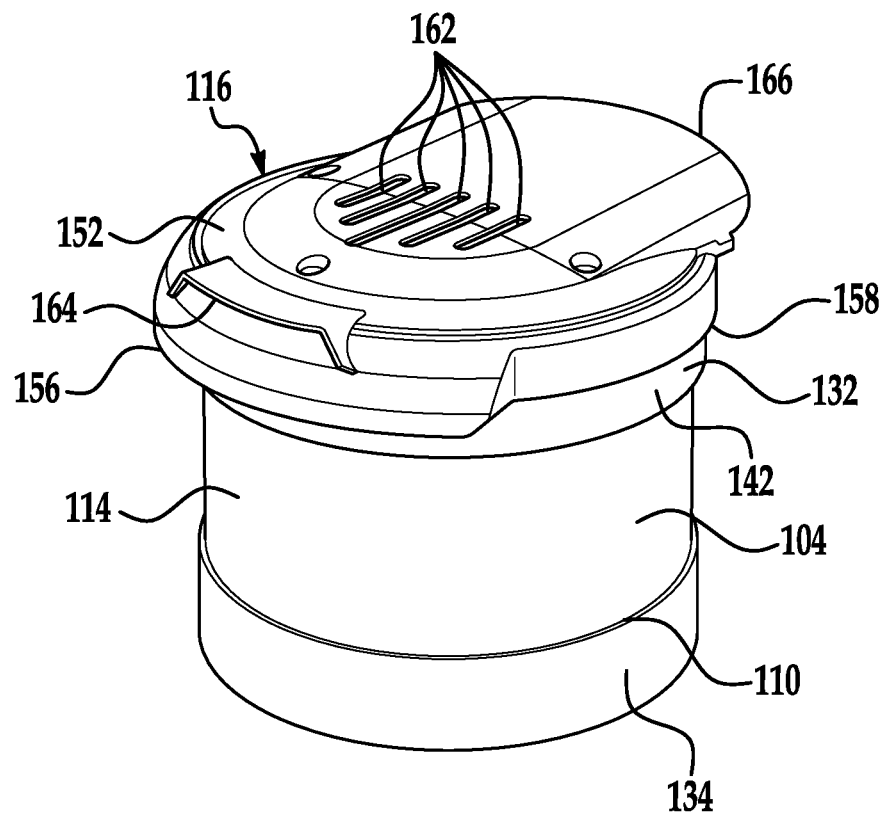
FIG. 6 is a perspective view of the sensor and the cover.

With reference to FIG. 6, the cover 116 is fixed relative to the sensor-housing top 132. For example, the cover 116 is bolted onto the sensor-housing top 132 by bolts 170 extending through the cover 116 and into the sensor-housing top 132.

The cover 116 is a thermally conductive polymer, i.e., a polymer with high thermal conductivity for a polymer, e.g., a thermal conductivity equal to at least 1.0 watts per meter-Kelvin (W/(m K)), e.g., greater than 5 W/(m K), at 25° C.

The cover 116 covers the top surface 118 and the heat pipes 106. The cover 116 extends along and conceals at least most of the top surface 118, e.g., at least 75% of the top surface 118, e.g., an entirety of the top surface 118, and the cover 116 extends along and conceals a portion of the lateral surface 142, e.g., an upper portion of the lateral surface 142 extending 360° around the axis A.

The cover 116 includes a cover top panel 152 facing generally upward. A contour of the cover 116, specifically, of the cover top panel 152, matches a contour of the top surface 118; e.g., the cover top panel 152 has a highest point where the axis A intersects the cover top panel 152, and the cover top panel 152 has a gradual downward slope radially outward from the axis A. The slope of the cover top panel 152 is closer to horizontal closer to the axis A and is steeper farther from the axis A.

Figure 7:
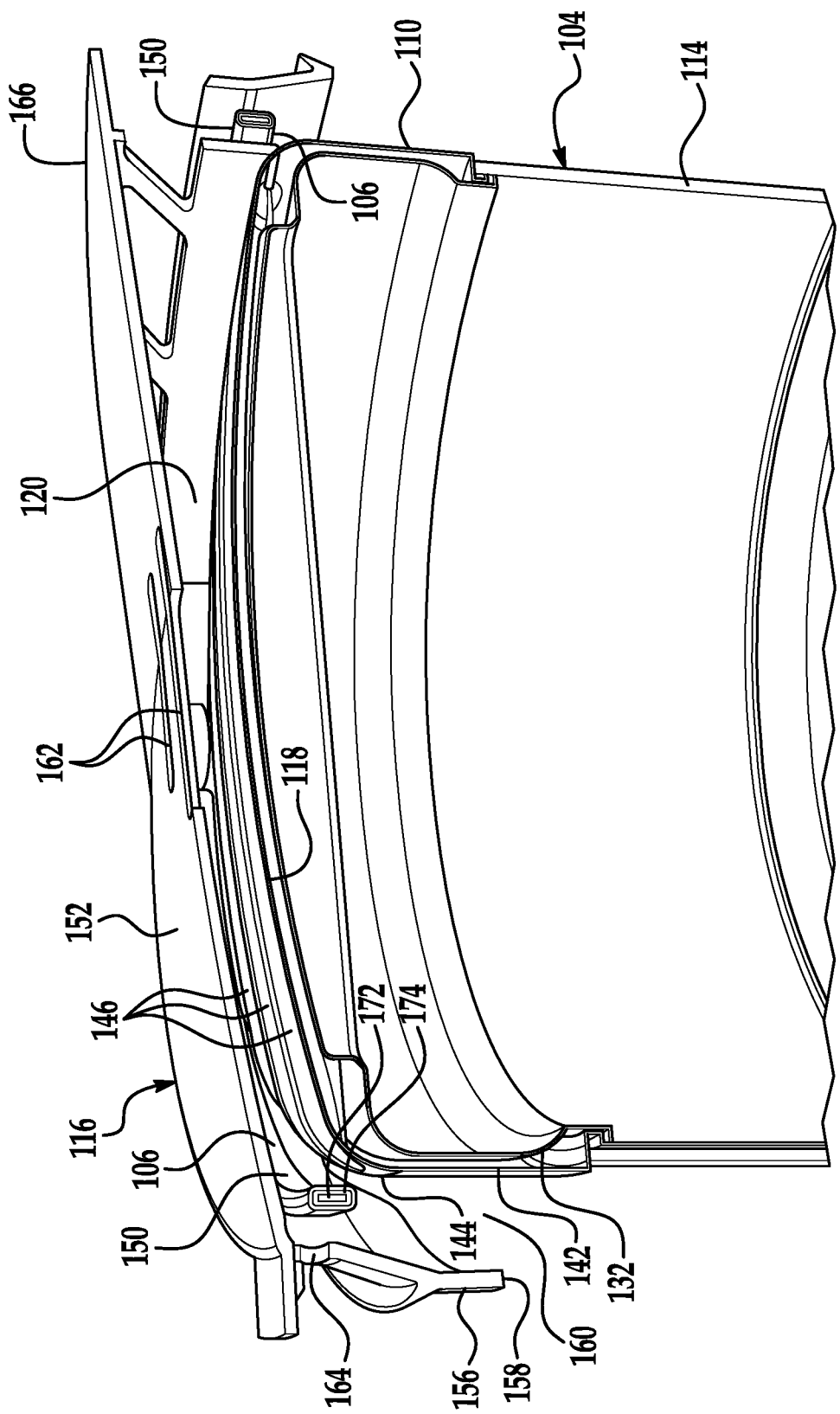
FIG. 7 is a cross-sectional perspective view of the sensor, the heat pipes, and the cover.

With reference to FIG. 7, the cover 116 is shaped to define the vertical gap 120 between the top surface 118 and the cover 116. The cover 116 is spaced vertically from the top surface 118 by the vertical gap 120 except at bolt attachment columns 154. The bolt attachment columns 154 are the only portion of the cover 116 that contacts the top surface 118. The size of the vertical gap 120 is approximately uniform across the portion of the top surface 118 directly below the cover top panel 152. The vertical gap 120 provides space for airflow across the top surface 118.

The cover 116 includes a lip 156. The lip 156 extends downward from the cover top panel 152 to a lower edge below the edge 144 of the top surface 118 and above the top edge 138 of the sensor window 114. The lip 156 extends from above the heat pipes 106 to below the heat pipes 106. The lip 156 extends circumferentially at least 270° around the axis A, e.g., 360° around the axis A.

The lip 156 and the lateral surface 142 form an inlet 158 permitting airflow from below the top surface 118 to the vertical gap 120 between the top surface 118 and the cover 116. The lip 156 defines a radial gap 160 from the lateral surface 142, and the radial gap 160 extends circumferentially around the axis A with the lip 156. The radial gap 160 is connected to the vertical gap 120 and air can flow smoothly through the radial gap 160 and then the vertical gap.

The air nozzle 122 is aimed at the inlet 158; in other words, a direction of discharge of the air nozzle 122 intersects the inlet 158. For example, the air nozzle 122 has a direction of discharge straight vertically upward, and the inlet 158 is positioned directly above the air nozzle 122. The inlet 158 faces toward the air nozzle 122, e.g., downward. The inlet 158 is open to the ambient environment, and airflow from the air nozzle 122 to the inlet 158 is exposed to the ambient environment.

The sensor window 114 is unobstructed from the bottom edge 136 to the top edge 138; e.g., no structures extend along the sensor window 114 between the air nozzle 122 and the inlet 158. The cover 116 and the air nozzle 122 are arranged so that the field of view of the sensor 104 through the sensor window 114 is unobstructed.

With reference to FIGS. 6 and 7, the cover 116 can include at least one vent 162, e.g., a plurality of vents 162 as shown in the Figures, positioned directly above the top surface 118 of the sensor 104. The vents 162 provide a path for air to flow from the vertical gap 120 to the ambient environment. At least one of the vents 162 can intersect the axis A. The vents 162 can be slot-shaped and oriented in a vehicle-forward direction, i.e., oriented parallel to the fins.

The cover 116 includes an intake opening 164 oriented to permit entry of horizontal airflow relative to the sensor 104 into the vertical gap 120. The intake opening 164 can be positioned directly horizontally from the vertical gap 120. The intake opening 164 can be oriented in a vehicle-forward direction and positioned in a vehicle-forward direction from the axis A.

The cover 116 includes an exhaust opening 166 oriented to permit exit of horizontal airflow relative to the sensor 104 from the vertical gap 120. The exhaust opening 166 can extend upward from the cover top panel 152. The exhaust opening 166 can be oriented in an opposite horizontal direction from the intake opening 164. For example, the exhaust opening 166 can be oriented in a vehicle-rearward direction and positioned in a vehicle-rearward direction from the axis A. A cross-sectional area of the exhaust opening 166 is greater than a cross-sectional area of the intake opening 164, which permits the exit of airflow from the intake opening 164 and from the inlet 158.

In operation, the air nozzle 122 blows air upward along the sensor window 114. The airflow can form an air curtain that prevents debris from hitting the sensor window 114 or blows debris off the sensor window 114. The airflow from the air nozzle 122 enters the inlet 158 and travels through the radial gap 160 and then the vertical gap 120 to the exhaust opening 166. While flowing from the radial gap 160 to the vertical gap 120, the airflow absorbs heat from the second segments 150 of the heat pipes 106. The heat pipes 106 draw out heat from the first segments 148 to the second segments 150 to be absorbed by the airflow. Airflow from motion of the vehicle 100 enters the intake opening 164 and also travels through the vertical gap 120 to the exhaust opening 166. The airflow absorbs heat generated by the sensor 104 via convection from the top surface 118 and the fins 146 and carries that heat away from the sensor apparatus 102. The cover 116 can reflect sunlight and thus at least partially prevent the sensor-housing top 132 from absorbing heat from the sunlight.

The disclosure has been described in an illustrative manner, and it is to be understood that the terminology which has been used is intended to be in the nature of words of description rather than of limitation. The adjectives "first" and "second" are used throughout this document as identifiers and are not intended to signify importance, order, or quantity. Terms such as "front," "forward," "back," "rearward," "left," "right," "side," "vertical," etc., are understood relative to the vehicle 100. Many modifications and variations of the present disclosure are possible in light of the above teachings, and the disclosure may be practiced otherwise than as specifically described.

The invention claimed is:

1. A sensor apparatus comprising:
a sensor including a sensor housing, wherein the sensor housing includes a sensor window oriented generally vertically and a top surface fixed relative to the sensor window above the sensor window and oriented generally horizontally;
a heat pipe fixed relative to the sensor, wherein the heat pipe is elongated from a first end to a second end, the first end is contacting the top surface, and the second end is spaced from the top surface; and
a cover covering the top surface and the heat pipe, wherein the cover is shaped to define a vertical gap between the top surface and the cover.

2. The sensor apparatus of claim 1, wherein the top surface includes an edge encircling the top surface, and the cover includes a lip extending below the edge.

3. The sensor apparatus of claim 2, wherein the sensor includes a lateral surface extending from the sensor window to the edge, and the lip and the lateral surface form an inlet permitting airflow from below the top surface to the vertical gap between the top surface and the cover.

4. The sensor apparatus of claim 3, further comprising an air nozzle, wherein the sensor window extends vertically from a bottom edge to a top edge, the air nozzle is positioned at the bottom edge, the lateral surface extends from the top edge, and the air nozzle is aimed at the inlet.

5. The sensor apparatus of claim 4, wherein the sensor window is unobstructed from the bottom edge to the top edge.

6. The sensor apparatus of claim 1, wherein the cover includes an intake opening oriented to permit entry of horizontal airflow relative to the sensor into the vertical gap.

7. The sensor apparatus of claim 6, wherein the cover includes an exhaust opening oriented to permit exit of horizontal airflow relative to the sensor from the vertical gap.

8. The sensor apparatus of claim 7, wherein a cross-sectional area of the exhaust opening is greater than a cross-sectional area of the intake opening.

9. The sensor apparatus of claim 7, wherein the intake opening and the exhaust opening are oriented in opposite horizontal directions.

10. The sensor apparatus of claim 1, wherein the cover includes at least one vent positioned directly above the top surface.

11. The sensor apparatus of claim 1, wherein the sensor window is cylindrical and defines an axis that is oriented vertically.

12. The sensor apparatus of claim 11, wherein the first end of the heat pipe is radially closer to the axis than the second end of the heat pipe.

13. The sensor apparatus of claim 12, wherein the top surface is circular and centered on the axis, and the second end of the heat pipe is radially outside the top surface relative to the axis.

14. The sensor apparatus of claim 13, further comprising a plurality of heat pipes including the heat pipe, wherein each heat pipe is elongated from a respective first end contacting the top surface to a respective second end spaced from the top surface, each first end of the respective heat pipe is radially closer to the axis than the respective second end of that heat pipe, and each second end of the respective heat pipe is radially outside the top surface relative to the axis.

15. The sensor apparatus of claim 11, wherein the top surface includes an edge encircling the top surface, and the cover includes a lip extending below the edge and extending at least 270° around the axis.

16. The sensor apparatus of claim 15, wherein the sensor includes a cylindrical lateral surface extending from the sensor window to the edge, the lip and the lateral surface form an inlet permitting airflow from below the top surface to the vertical gap between the top surface and the cover, and the inlet extends at least 270° around the axis.

17. The sensor apparatus of claim 1, wherein the top surface includes a plurality of fins oriented parallel to each other.

18. The sensor apparatus of claim 17, wherein the heat pipe includes a first segment extending from the first end, and the first segment is oriented parallel to the fins and positioned directly between two adjacent fins of the plurality of fins.

19. The sensor apparatus of claim 18, wherein the heat pipe includes a second segment extending from the first segment to the second end, and the second segment is spaced from the top surface.

\* \* \* \* \*